United States Patent
Nall et al.

(10) Patent No.: US 7,633,055 B2
(45) Date of Patent: Dec. 15, 2009

(54) SEALED LIGHT EMITTING DIODE ASSEMBLIES INCLUDING ANNULAR GASKETS AND METHODS OF MAKING SAME

(75) Inventors: Jeffrey Nall, Brecksville, OH (US); Babi Koushik Saha, Brunswick, OH (US); Bill Xin Wang, Shanghai (CN)

(73) Assignee: Lumination LLC, Valley View, OH (US)

( * ) Notice: Subject to any disclaimer, the term of this patent is extended or adjusted under 35 U.S.C. 154(b) by 0 days.

(21) Appl. No.: 11/715,746

(22) Filed: Mar. 8, 2007

(65) Prior Publication Data

US 2008/0220549 A1 Sep. 11, 2008

(51) Int. Cl.
*H01J 40/14* (2006.01)
*H01J 5/02* (2006.01)

(52) U.S. Cl. .............. 250/239; 250/208.1; 257/678; 438/127

(58) Field of Classification Search .......... 250/208.1, 250/214, 214 R, 239; 257/88, 99, 100, 431–434, 257/678, 778, 790; 362/249, 252, 294; 438/127
See application file for complete search history.

(56) References Cited

U.S. PATENT DOCUMENTS

| | | | |
|---|---|---|---|
| 4,920,555 A | 4/1990 | Ingalsbe | |
| 5,783,134 A * | 7/1998 | Yabe et al. | 264/272.14 |
| 6,825,551 B1 * | 11/2004 | Do Bento Vieira | 257/678 |
| 7,081,667 B2 | 7/2006 | Du | |
| 7,102,213 B2 * | 9/2006 | Sorg | 257/667 |
| 7,160,140 B1 | 1/2007 | Mrakovich et al. | |
| 2002/0122134 A1 | 9/2002 | Kalua | |
| 2005/0201091 A1 | 9/2005 | Kramer et al. | |
| 2005/0239227 A1 * | 10/2005 | Aanegola et al. | 438/26 |
| 2006/0087851 A1 | 4/2006 | Dubord | |

(Continued)

FOREIGN PATENT DOCUMENTS

EP 632511 A2 * 1/1995

(Continued)

OTHER PUBLICATIONS

U.S. Appl. No. 11/289,672, filed Nov. 2005, Nall et al.

(Continued)

*Primary Examiner*—Thanh X Luu
*Assistant Examiner*—Francis M Legasse, Jr.
(74) *Attorney, Agent, or Firm*—Fay Sharpe LLP

(57) ABSTRACT

An optoelectronic device assembly includes a circuit board and an optoelectronic device disposed on the circuit board and electrically connected with the circuit board. An annular gasket is disposed on the circuit board and surrounds the optoelectronic device. A sealant is disposed over and seals at least a portion of the circuit board and also covers at least an outer annular portion of the annular gasket. The sealant is not disposed over the optoelectronic device. In a method, an optoelectronic device is disposed on a circuit board, the disposing including electrically connecting the optoelectronic device with the circuit board. An annular gasket is disposed on the circuit board to surround the optoelectronic device. The circuit board is sealed with a sealant that also covers at least an outer annular portion of the annular gasket, but does not cover the optoelectronic device.

13 Claims, 8 Drawing Sheets

U.S. PATENT DOCUMENTS

| | | | |
|---|---|---|---|
| 2006/0151868 A1* | 7/2006 | Zhu et al. | 257/690 |
| 2006/0215422 A1 | 9/2006 | Laizure, Jr. et al. | |
| 2006/0282987 A1 | 12/2006 | Shih et al. | |
| 2006/0289054 A1 | 12/2006 | Iverson et al. | |
| 2006/0291241 A1 | 12/2006 | Wojtowicz et al. | |
| 2007/0015396 A1 | 1/2007 | Mrakovich et al. | |
| 2007/0121326 A1* | 5/2007 | Nall et al. | 362/294 |

FOREIGN PATENT DOCUMENTS

| | | |
|---|---|---|
| JP | 2002168713 A * | 6/2002 |
| WO | WO 2006/017595 | 2/2006 |
| WO | WO 2007/008928 | 1/2007 |

OTHER PUBLICATIONS

Nichia Corp., "Specifications for Nichia Chip Type White LED, Model: NS6W083T," at http://www.nichia.com/product/led-smd-powerled.html, pp. 12, on Jun. 6, 2006.

GLS Corporation, "Overmolding Guide," pp. 1-31, 2004.

Injection Molding, "Simplifying multicomponent design," Canon Communications LLC, pp. 3, 2004.

* cited by examiner

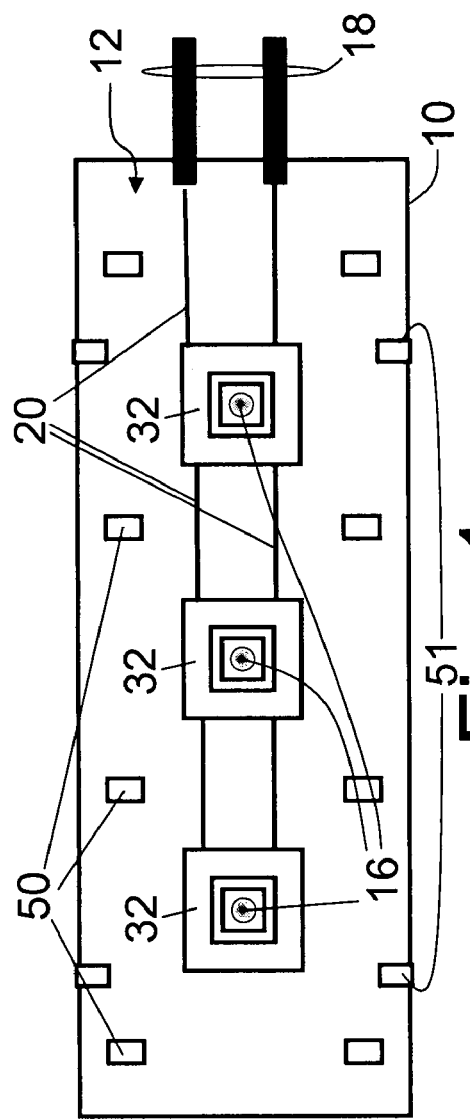
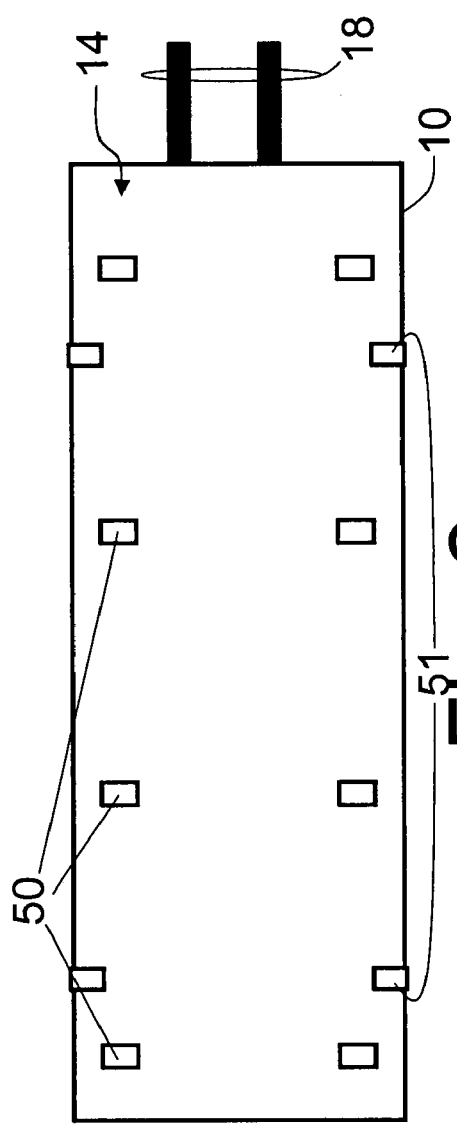

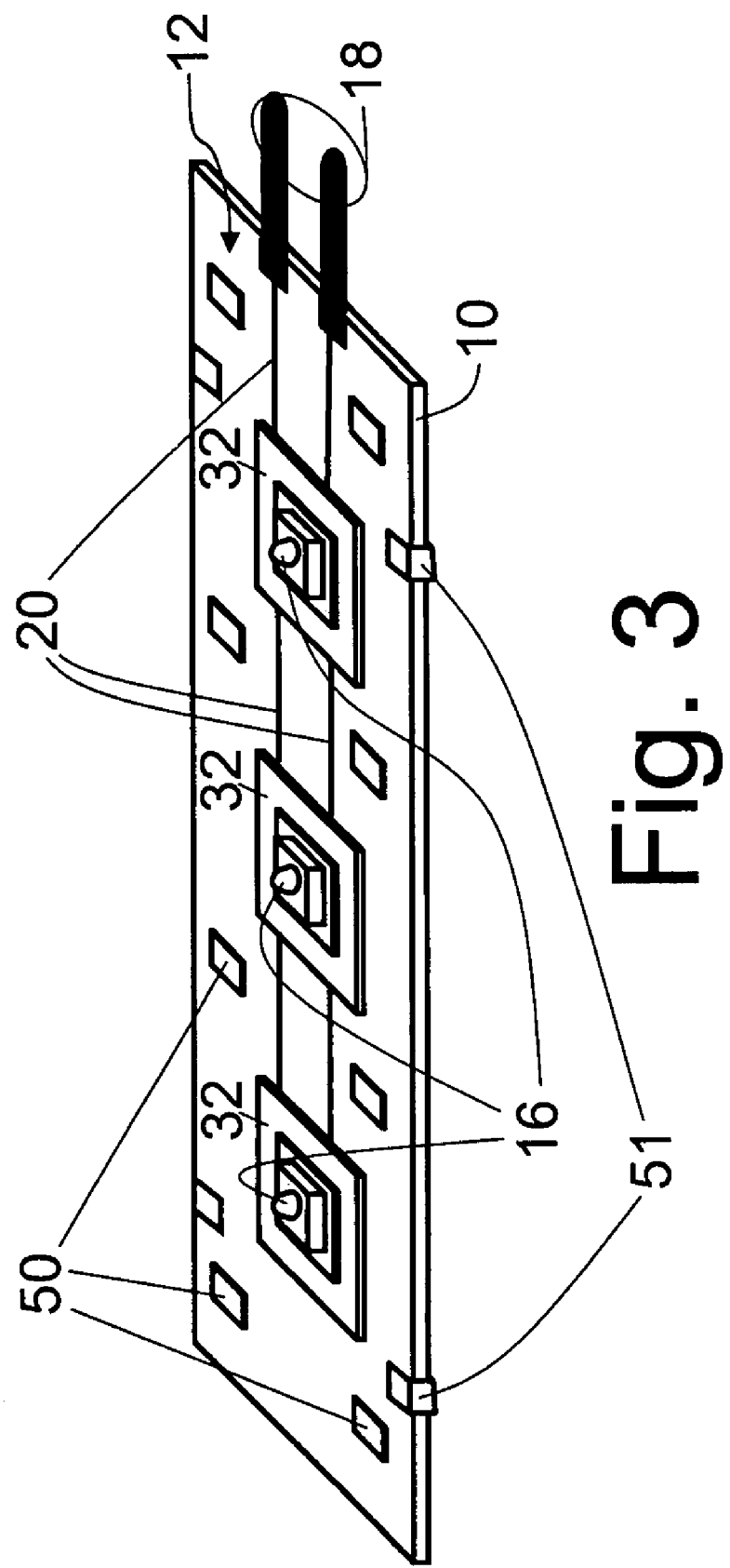

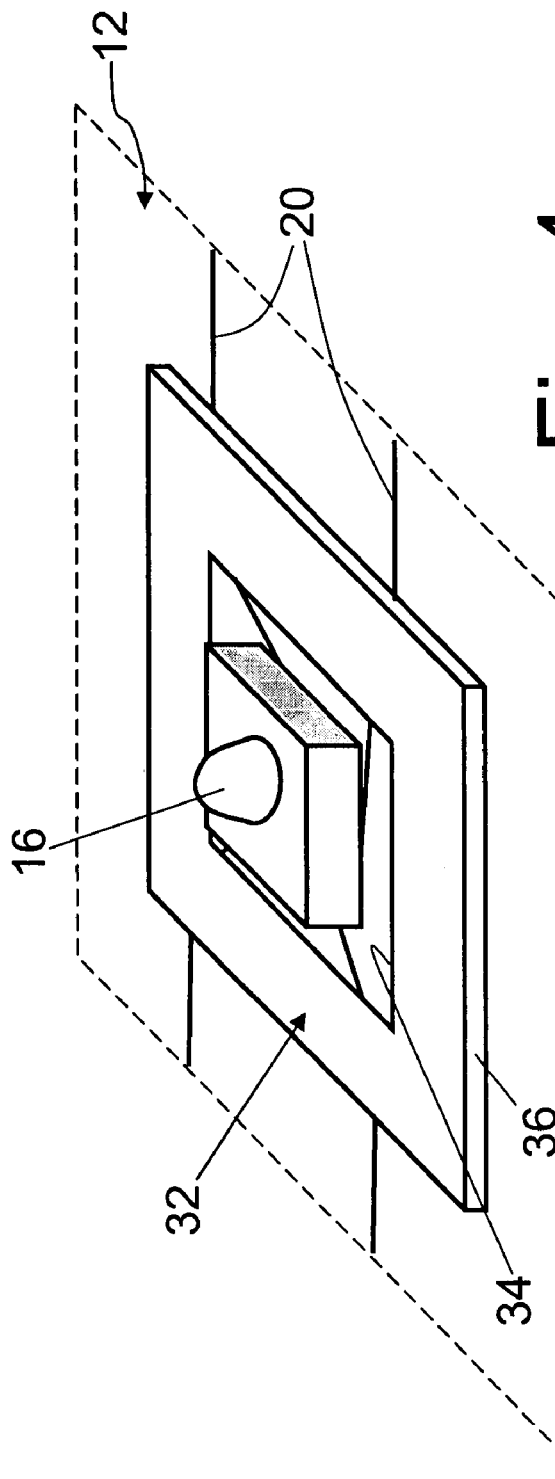
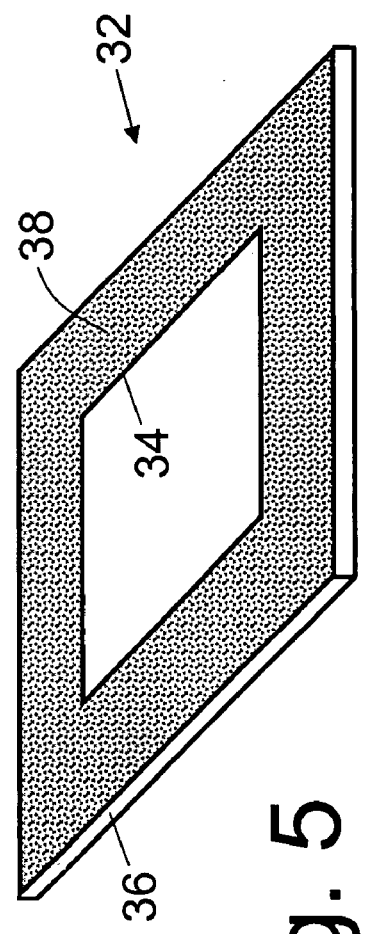
Fig. 4
Fig. 5

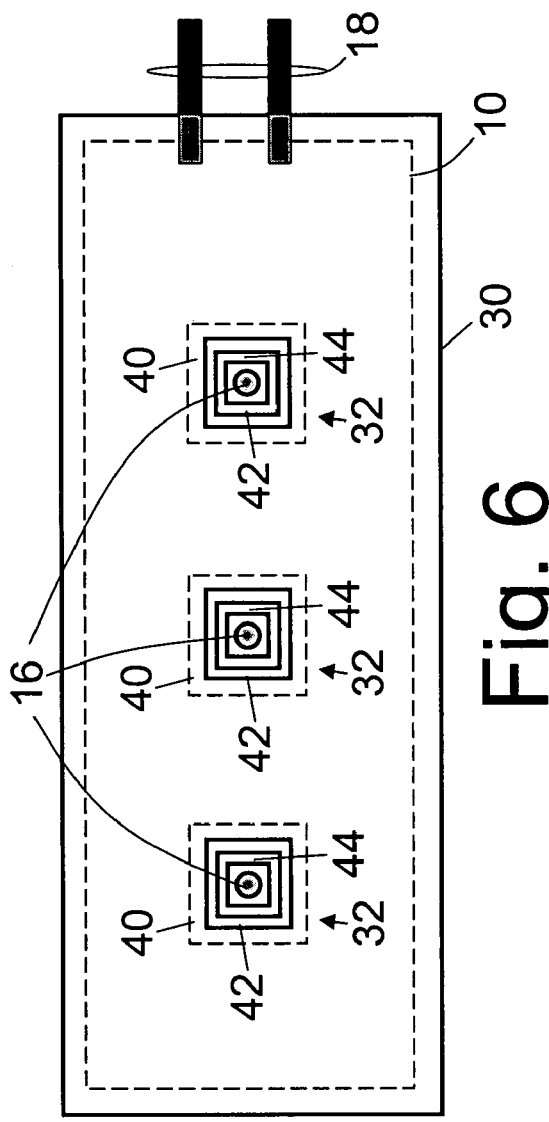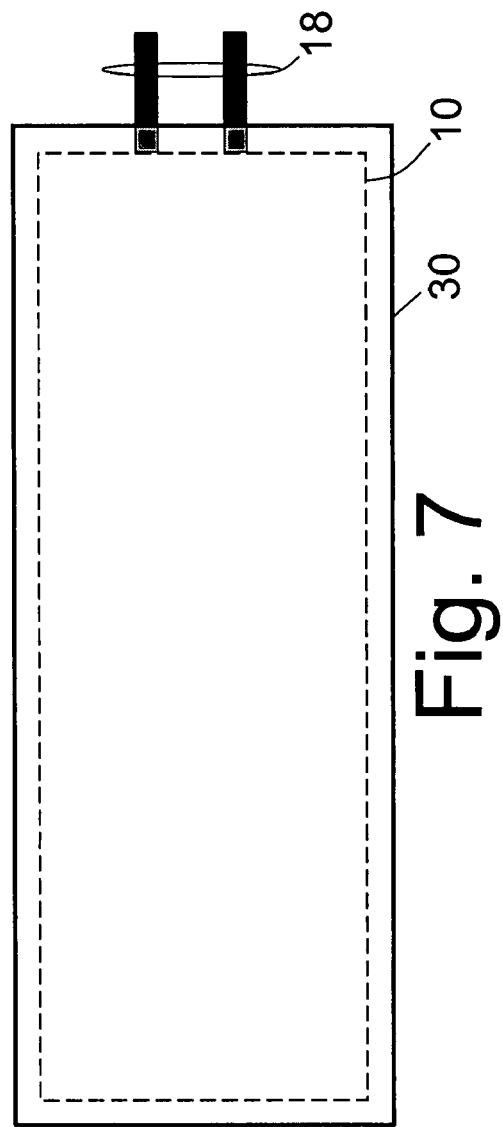

SEALED LIGHT EMITTING DIODE ASSEMBLIES INCLUDING ANNULAR GASKETS AND METHODS OF MAKING SAME

BACKGROUND

The following relates to the optoelectronic arts. It especially relates to light emitting diode-based assemblies and methods for making same. However, the following will also find application in conjunction with other optoelectronic device assemblies, such as photodetector assemblies, laser diode assemblies, solar cell assemblies, and so forth, and in methods for making same.

Light emitting diode assemblies are of interest for lighting, display, lighted signage, and other applications. A typical light emitting diode assembly includes one or more light emitting diode packages mounted on a circuit board that serves as a mechanical substrate and provides electrical connection between the light emitting diode package or packages and an electrical power path or input.

Some light emitting diode assemblies are used in applications, such as outdoor applications, automotive applications, or so forth, that expose the assembly to weathering or other environmental hazards. In outdoor applications, for example, exposure to rain, snow, humidity, or the like can produce water-related damage to the light emitting diode assembly.

One known approach to protecting light emitting diode assemblies from such environmental hazards is to provide an outer waterproof container or housing. For maximum light output, the housing should include openings through which the light emitting diodes emit light. However, it is difficult to make an adequately waterproofed housing. Incorporating a waterproof housing also increases the cost and complexity of the light emitting diode assembly.

Overmolding, potting, or other sealing approaches are also known. Indeed, it is well known to pot electronics for the purpose of protecting the electronics from environmental hazards. However, a difficulty arises in the case of a light emitting diode assembly, in that light emission from the overmolded, potted, or otherwise sealed assembly should not be inhibited.

One option is to use a light-transmissive sealant. However, this limits the selection of sealant materials. Additionally, some light absorption or light scattering can be expected even in a nominally light-transmissive sealant.

Another approach is to avoid sealing the light emitting diode packages. In a typical approach, the tooling mold includes generally hollow members, sometimes called pins, that isolate the light emitting diode package from the injected sealant material during injection overmolding.

A sealant that does not cover the light emitting diode packages advantageously reduces exposure-related degradation and failures of light emitting diode assemblies, while providing unimpeded light output. However, some exposure-related assembly degradation and occasional failures are still observed. Even a relatively low failure rate is problematic for some type of light emitting diode assemblies. For example, failure of outdoor illuminated signage can result in lost advertising or adverse advertising in the form of an unsightly unlit sign. Failure of automotive lighting assemblies may manifest as a "broken taillight" or other inoperative vehicle light. Failure of a traffic light, crosswalk light, railway light, or other directional signage can confuse travelers and reduce traffic flow efficiency.

An intermediate option is to use a light-transmissive sealant applied as part of a two-shot overmolding process. For example, in a first shot a thin transparent sealant is disposed over the light emitting diode packages, and in a second shot the bulk of the overmolding is applied. Advantageously, this approach allows the molding material and thickness of each step to be selected for its specific purpose. By using a thin first-shot overmolding of a highly transparent material light absorption, scattering, or so forth is reduced. The second shot can then apply a thick overmolding of a material that need not have any special optical characteristics, and indeed can be completely opaque to light generated by the light emitting diode packages.

However, two-shot overmolding is problematic from a manufacturing standpoint. The cost of two-shot overmolding is substantially higher than the cost of single-shot overmolding. Moreover, two-shot overmolding employs more complex machinery including mechanisms to change the geometry of filling cavities, the use of two different injectors, and so forth. The additional complexity can adversely affect factory uptime, device yield, and other manufacturing productivity metrics.

The following contemplates improved assemblies and methods that overcome the above-mentioned limitations and others.

BRIEF SUMMARY

According to one aspect, a method is illustrated, comprising: disposing an optoelectronic device on a circuit board, the disposing including electrically connecting the optoelectronic device with the circuit board; disposing an annular gasket on the circuit board to surround the optoelectronic device; and sealing the circuit board with a sealant that also covers at least an outer annular portion of the annular gasket, but does not cover the optoelectronic device.

According to another aspect, an optoelectronic device assembly is illustrated, comprising: a circuit board; an optoelectronic device disposed on the circuit board and electrically connected with the circuit board; an annular gasket disposed on the circuit board and surrounding the optoelectronic device; and a sealant disposed over and sealing at least a portion of the circuit board and also covering at least an outer annular portion of the annular gasket, the sealant not being disposed over the optoelectronic device.

Numerous advantages and benefits of the present invention will become apparent to those of ordinary skill in the art upon reading and understanding the present specification.

BRIEF DESCRIPTION OF THE DRAWINGS

The invention may take form in various components and arrangements of components, and in various process operations and arrangements of process operations. The drawings are only for purposes of illustrating preferred embodiments and are not to be construed as limiting the invention.

FIGS. 1-3 diagrammatically show top, bottom, and perspective views, respectively, of a circuit board with three light emitting diode packages disposed thereon, each of which is surrounded by an annular gasket.

FIG. 4 shows a perspective view of one of the light emitting diode packages of FIGS. 1-3 along with its surrounding annular gasket.

FIG. 5 shows a perspective view of an underside of one of the annular gaskets including an adhesive disposed on the underside.

FIGS. 6-8 diagrammatically show top, bottom, and perspective views, respectively, of a light emitting diode assembly formed by overmolding the circuit board of FIGS. 1-3 with the overmolding not being disposed over the three light emitting diode packages.

FIG. 10 shows a circuit board with three light emitting diode packages and an electronic integrated circuit disposed between portions of a mold. FIG. 11 shows the mold portions closed together about the circuit board with the three light emitting diode packages and the electronic integrated circuit. FIG. 12 shows the light emitting diode assembly comprising the circuit board with the three light emitting diode packages and the electronic integrated circuit, and the overmolding formed by injection overmolding using the closed mold shown in FIG. 11.

DETAILED DESCRIPTION OF PREFERRED EMBODIMENTS

Figure 8:
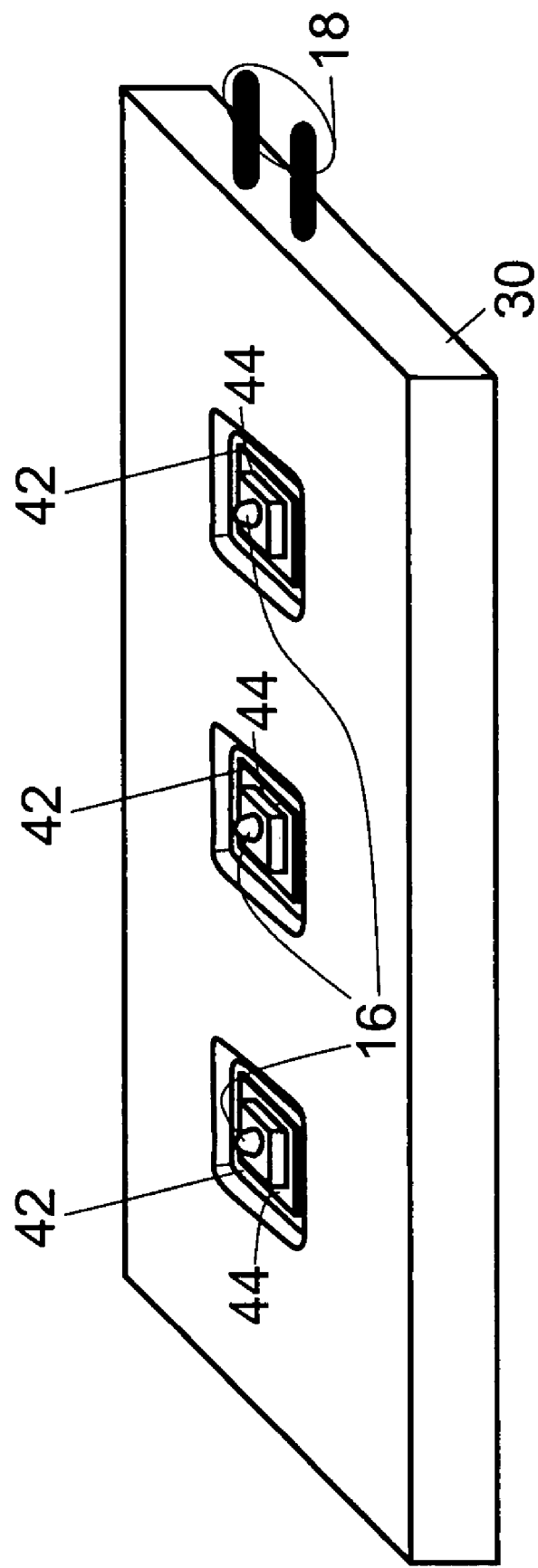

With reference to FIGS. 1-3, an optoelectronic device assembly includes a circuit board 10 having a frontside 12 and a backside 14. One or more optoelectronic devices, such as an illustrative three light emitting diode packages 16, are disposed on the frontside 12 of the circuit board 10. Electrical inputs 18, such as prongs, connectors, wires, or the like, are disposed at one end of the circuit board 10. The circuit board 10 includes circuitry, such as illustrated printed circuitry 20 disposed on the frontside 12, or a circuitry layer internal to the circuit board 10, or so forth, that electrically connects with the light emitting diode packages 16 and with the electrical inputs 18 such that the light emitting diode packages 16 are configured to be powered via the electrical inputs 18.

The configuration of FIGS. 1-3 is an illustrative example. In general, one or more optoelectronic devices are disposed on a frontside of a circuit board, and optionally one or more additional optoelectronic devices may be disposed on a backside of the circuit board. A pathway including at least circuitry of the circuit board is configured to enable electrical power to be delivered to the one or more optoelectronic devices, or to receive a signal from the one or more optoelectronic devices, or to both provide power and receive a signal. While a wired pathway is illustrated via the illustrative electrical inputs 18, it is also contemplated to include wireless transmission in the pathway—for example, a photodetector may detect a signal that is converted to a radio frequency that is transmitted off the optoelectronic device assembly. Moreover, in some embodiments a battery or other on-board power source (not shown) is included, in which case the assembly may optionally have no wired or wireless electrical connections. The illustrated circuitry 20 is printed circuitry disposed on a frontside of the illustrative circuit board 10; however, the circuitry of the circuit board can in general be arranged at the front or back surface of the circuit board, in one or more interior circuit layers disposed inside the circuit board, or in various combinations of such arrangements. Although not specifically illustrated, it is contemplated for the circuit board to be a metal core printed circuit board or to otherwise incorporate a thermally conductive layer for heat spreading, heat sinking, or other thermal management, or to define an electrical ground plane, or to perform both functions or other functions. The optoelectronic device assembly optionally includes other elements, such as additional integrated circuit components or discrete electrical components disposed on the circuit board to define power conditioning circuitry, control circuitry, or other electrical functionality. The optoelectronic device assembly optionally includes optical components such as lenses, windows, wavelength-converting phosphor layers, reflectors, or so forth, mechanical components such as mounting features, and so forth.

The illustrated light emitting diode packages 16 are surface mount light emitting diode packages, but other light emitting diode packages configured for mounting on a circuit board can be used. Each light emitting diode package 16 typically includes a light emitting diode chip made of one or more layers or portions of a group III-nitride semiconductor or semiconductor structure, a group III arsenide semiconductor or semiconductor structure, a group III-phosphide semiconductor or semiconductor structure, another light emissive semiconductor material or layered or otherwise organized arrangement of such semiconductor materials, an organic semiconductor or semiconductor structure, or so forth. The light emitting diode chip is electrically connected to electrical leads or a lead frame and is optionally mechanically sealed by a suitable light-transmissive encapsulant. Optionally, the light emitting diode packages may include other elements, such as a microlens, redundant leads, heat-sinking metallic slug, a sub-mount optionally incorporating electrostatic discharge protection circuitry, a reflective cup containing the light emitting diode chip, a wavelength converting phosphor, or so forth. In some embodiments, a single light emitting diode package may include two or more light emitting diode chips, such as red, green, and blue light emitting diode chips defining an "RGB" type color-controllable light emitting diode package.

In addition to, or alternative to, the illustrated light emitting diode packages 16, the one or more optoelectronic devices disposed on the circuit board 10 may include, for example: one or more photodetectors; one or more laser diode packages; one or more solar cells; or so forth. The one or more optoelectronic devices may include two or more different types of optoelectronic devices on the same circuit board. In one example, a photosensor and associated electronics disposed on the circuit board are configured to detect a low ambient light condition, and a plurality of light emitting diode packages and associated electronics are configured to generate illumination responsive to the photosensor and its associated electronics indicating low ambient light.

With continuing reference to FIGS. 1-3 and with further reference to FIGS. 4-8, the circuit board 10 is sealed by a sealant 30 which may be, for example, an injection overmolding, a potting, or so forth. The sealant 30 is a substance that seals the surface of the circuit board 10, and optionally components disposed thereon, to prevent liquid or gas such as water, moisture, humidity, or so forth, from reaching the surface of the circuit board 10. However, the sealant 30 does not cover the one or more optoelectronic devices 16. In some embodiments, the sealant 30 is substantially opaque respective to radiation generated or received by the optoelectronic devices 16, in which case avoiding covering the optoelectronic devices 16 by the sealant 30 avoids rendering the devices 16 inoperative. However, even if the sealant 30 is translucent or transmissive for radiation generated or received by the optoelectronic devices 16, it may be advantageous to avoid covering the optoelectronic devices 16 by the sealant 30 to avoid light attenuation, light scattering, light diffraction, or other optical effects that may be deemed undesirable.

The inventors have studied the problem of degradation over time of commercial light emitting diode assemblies including a circuit board, one or more light emitting diode packages mounted on the circuit board, and thermoplastic overmolding of the circuit board, when such devices are used for extended time outdoors or in other rigorous environments. In these commercial devices, pins or generally hollow members were disposed over the light emitting diode packages during the overmolding process, so that the thermoplastic overmolding does not cover the light emitting diode packages. The inventors have found that environmental exposure of the light emitting diode packages due to lack of overmolding produces relatively little degradation of the light emitting diode packages and their attachment to the circuit board. Nonetheless, the inventors have found that device degradation and occasional failures occur. The inventors believe that such degradation and occasional failure of the light emitting diode assemblies primarily results from water ingress at the openings for the light emitting diode packages. It is believed that the water ingresses at the opening, and then travels along the overmolding/circuit board interface, resulting in corrosion of the circuit board which can sometimes lead to failure or performance degradation.

The inventors have developed the following solution to this problem. One or more annular gaskets 32 are disposed on the circuit board 10 with an annular gasket 32 disposed to surround each optoelectronic device 16 that is to remain exposed after the sealant 30 is applied. As used herein, the term "annular" means that the annular gasket 32 surrounds the optoelectronic device 16 and has a central opening in which the optoelectronic device 16 is disposed. The term "annular" is not limited to circular gaskets, and indeed each illustrated annular gasket 32 has a square or rectangular inner perimeter 34 (labeled only in FIGS. 4 and 5) substantially conforming with an outer perimeter of the light emitting diode package 16, and further has a square outer perimeter 36 (again labeled only in FIGS. 4 and 5). In other embodiments, the annular gasket may have a square, rectangular, circular, elliptical, or otherwise-shaped inner perimeter, and a square, rectangular, circular, elliptical, or otherwise-shaped outer perimeter. It is contemplated for the inner and outer perimeters to be differently shaped, such as having a square inner perimeter and a round outer perimeter. Moreover, in some embodiments the inner perimeter of the gasket may be non-conformal with an outer perimeter of the corresponding optoelectronic device; for example, the gasket may have a circular inner perimeter while the optoelectronic device may have a square outer perimeter.

With particular reference to FIG. 5, in some embodiments the annular gasket 32 includes an adhesive 38 disposed on an underside of the gasket 32. The optional adhesive 38 aids in placement and retention of the annular gasket 32 on the frontside 12 of the circuit board 10 prior to sealing by the sealant 30. Optionally, the adhesive 38 defines a seal between the annular gasket 32 and the circuit board 10. Such an adhesive could also be disposed on the circuit board 10, instead of on the gasket 32, with the same result that adhesive between the gasket and the circuit board defines a seal. Similarly, an adhesive could be disposed between the LED and the inside of the annular gasket 32 to promote sealing of that gap. On the other hand, in some embodiments the adhesive 38 is omitted.

With particular reference to FIGS. 6-8, the illustrative sealant 30 is an injection overmolding disposed over and sealing the front and back sides 12, 14 of the circuit board 10, and in the illustrated assembly sealing the entire circuit board 10. The sealant 30 also forms a seal with each annular gasket 32. However, the sealant is not disposed over the optoelectronic devices 16. These features are best seen in FIGS. 6 and 8. In FIGS. 6 and 7, selected principal features of the overmolded circuit board 10 which are covered by the sealant are indicated in phantom by dashed lines. In the embodiment of FIGS. 6-8, the sealant 30 forms a seal with an outer annular portion 40 of each annular gasket 32, while an inner annular portion 42 of each annular gasket 32 remains uncovered by the sealant 30. (The outer annular portion 40 is labeled only in FIG. 6, while the inner annular portion is labeled only in FIGS. 6 and 8). The sealant 30 has a conformal interface with at least the outer annular region 40 of the annular gasket 32, and the annular gaskets 32 are of one piece with the sealant 30 after the overmolding process is completed and the sealant 30 has solidified.

In the embodiment illustrated in FIGS. 6-8, the sealant 30 does not contact the light emitting diode packages 16. There is a gap 44 between the sealant 30 and each light emitting diode package 16. (The gap 44 is labeled only in FIGS. 6 and 8). The illustrated gap 44 enhances manufacturing yield and reduces a likelihood of damage to the optoelectronic device during the injection overmolding process.

In some injection overmolding approaches, the circuit board 10 is disposed in an injection region of a tooling mold that includes a generally hollow member receiving each corresponding light emitting diode package 16 and having an edge sealing against the gasket 32 to isolate the light emitting diode package 16 from the injection region of the tooling mold. The term "generally hollow member" is intended to denote a member having an isolated volume sufficient to receive the light emitting diode package 16 so as to isolate the light emitting diode package 16 from the injected sealant material. The annular gaskets 32 are advantageously made of a resilient material, such as a rubber material, to promote sealing.

In some embodiments, additional pads 50 (shown in FIGS. 1-3) of such resilient material (or of another resilient material) are disposed on the front and back sides 12, 14 of the circuit board 10 to provide anchors for positioning and support pins of the tooling mold. Alternatively or additionally, fold-over pads 51 can be folded over an edge of the circuit board to provide anchors along the edge on both the front and backsides of the circuit board 10. Pads 50, fold-over pads 51, or both can be used for positioning the circuit board 10 in the tooling mold. During the overmolding process, the positioning or support pins will define openings in the filling overmolding material that translate into openings in the finished overmolding. An opening in the overmolding will be present at the location of each support or positioning pin. The pads 50, 51 provide sealing at those openings. Additionally, if the pads 50, 51 are made of a resilient material, then they provide a resilient buffer for the tooling mold pins to press against, thus reducing mechanical stress on the circuit board 10. In some embodiments, the gaskets 32 and the pads 50, 51 are made of the same material. For example, the gaskets 32 and the pads 50, 51 can be conveniently cut out of a common sheet of rubber, polyvinyl chloride (PVC), or other resilient material. The optional adhesive 38 may coat an entire side of such a sheet, so that each gasket 32 or pad 50, 51 that is cut out has adhesive on one side. Adhesive can be useful, for example, to position and retain the pads 50 on the circuit board 10, or to position and fix the fold-over pads 51 on the edge of the circuit board 10.

Once the circuit board 10 is loaded into the injection mold, a sealant material is injected into the injection region of the mold, optionally under an applied pressure. The injected sealant material is blocked by the pins or generally hollow members and the cooperating annular gaskets 32 from reaching the light emitting diode packages 16. The injected liquid sealant material solidifies in the tooling mold to form the illustrated injection overmolding sealant 30. In some embodiments, the sealant 30 is an injected thermoplastic overmolding. In some embodiments, the injection overmolding sealant 30 is a PVC material. After the injected sealant material solidifies to define the sealant 30 having openings defined by the generally hollow members that leave the light emitting diode packages 16 exposed, the circuit board 10 is removed from the mold.

Figure 9:
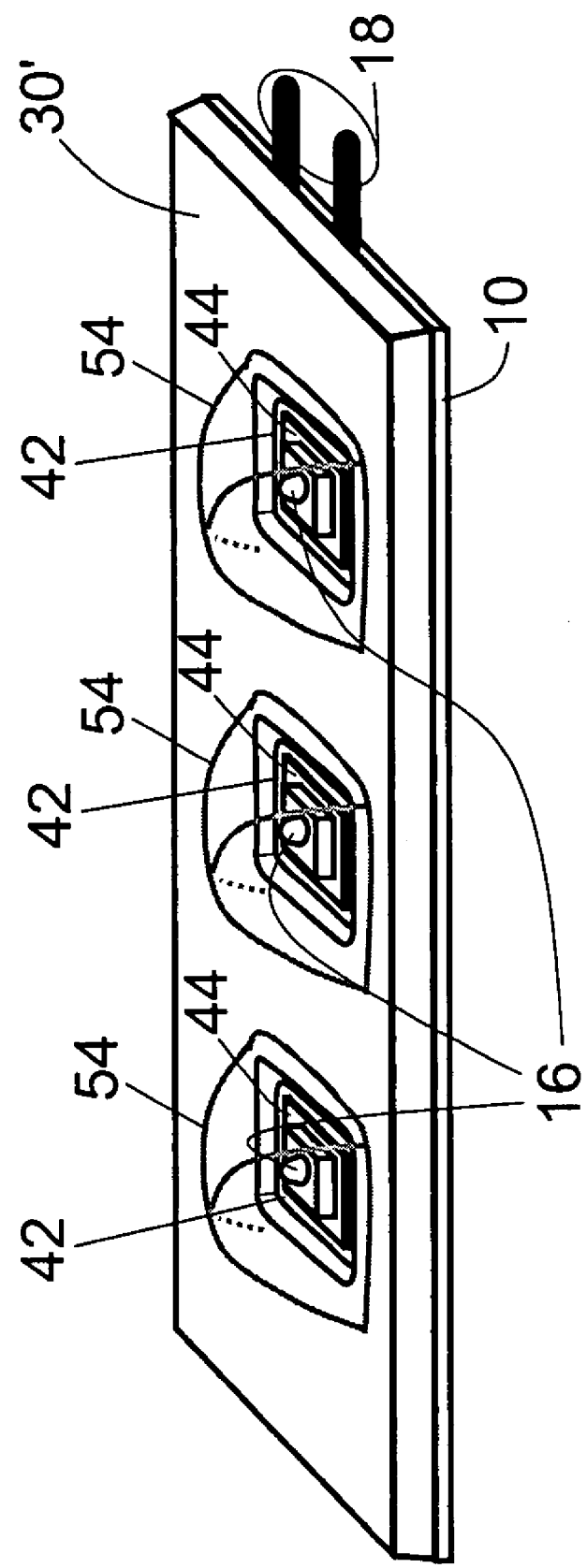
FIG. 9 diagrammatically shows a perspective view of a light emitting diode assembly formed by potting the frontside of the circuit board of FIGS. 1-3, the potting not being disposed over the three light emitting diode packages.

With reference to FIG. 9, in a modified optoelectronic device assembly the injection overmolded sealant 30 is replaced by an alternative potting or hot melt sealant 30' that in the embodiment shown in FIG. 9 is disposed only over the frontside 12 of the circuit board 10. The potting may be, for example, an epoxy potting. Having the backside 14 uncovered by the sealant 30' can be beneficial, for example, if the backside 14 of the circuit board 10 includes a metal core that provides a large-area heat sinking pathway. The potting process typically includes placing the circuit board 10 in a support that together with the frontside 12 defines an interior volume. The support includes pins or other generally hollow members that receive the optoelectronic devices 16 and have edges sealing against the gaskets 32 to isolate the optoelectronic devices 16 from the interior volume to be potted. The potting material is either disposed in the support before the circuit board 10 is loaded, or is flowed into the interior volume after the circuit board 10 is loaded. The potting material solidifies or cures, optionally with the assistance of heat, light exposure, or another curing aid, and the assembly including the circuit board 10 and the potting 30' is removed from the support. Although the illustrated potting 30' is disposed over only the frontside 12 of the circuit board 10, in other embodiments the potting may be disposed over both front and backsides 12, 14 in similar fashion to the injection overmolding 30 shown in FIGS. 6-8.

The illustrative embodiment of FIG. 9 further includes a transmissive encapsulant 54 substantially filling the openings in the sealant 30'. The transmissive encapsulant 54 is transmissive for radiation generated or received by the optoelectronic devices 16. For example, the encapsulant 54 may be a transmissive silicone encapsulant. Optionally, the transmissive encapsulant 54 is shaped to define a lens or other optic. In other embodiments, the openings may be covered by a microlens, or a continuous sheet of transmissive material may be placed over the sealant 30', or so forth. While the encapsulant 54 is illustrated in FIG. 9 in conjunction with the potting 30', it will be appreciated that the encapsulant, microlenses, or other components may be disposed in or over the corresponding openings in the injection overmolding sealant 30 or over corresponding openings in other types of sealants.

In some embodiments the sealant 30, 30' and the gaskets 32 are made of the same material. For example, both the injection overmolding 30 and the gaskets 32 may be made of polyvinyl chloride (PVC) materials. Such material similarity can promote cohesive sealing between the sealant 30, 30' and the gaskets 32. As used herein, the "same material" specifies materials with sufficient similarity to promote cohesive bonding. For example, the gaskets 32 may be PVC material made by a method other than molding or potting, may have some compositional differences compared with the PVC sealant 30, 30', or may have other differences, but the PVC sealant 30, 30' and PVC gaskets 32 are of sufficiently similar material to cohesively bind, and hence are considered to be of the same material.

In other embodiments, the sealant 30, 30' and the gaskets 32 are made of different materials that exhibit sufficient binding to define an effective seal between the sealant 30, 30' and the gaskets 32. For example, the sealant 30, 30' may be made of a PVC material while the gaskets 32 are made of a rubber material. Experiments performed by the inventors demonstrate that the annular gaskets 32 should be made of a sufficiently hard material to avoid excessive deformation or severing by the sealing pins or sealing generally hollow members during the sealing process. In some embodiments, the annular gaskets 32 have a hardness as measured in durometer of 40 Shore-A hardness or higher, and may have higher hardness up to a fully rigid material.

Figure 10:
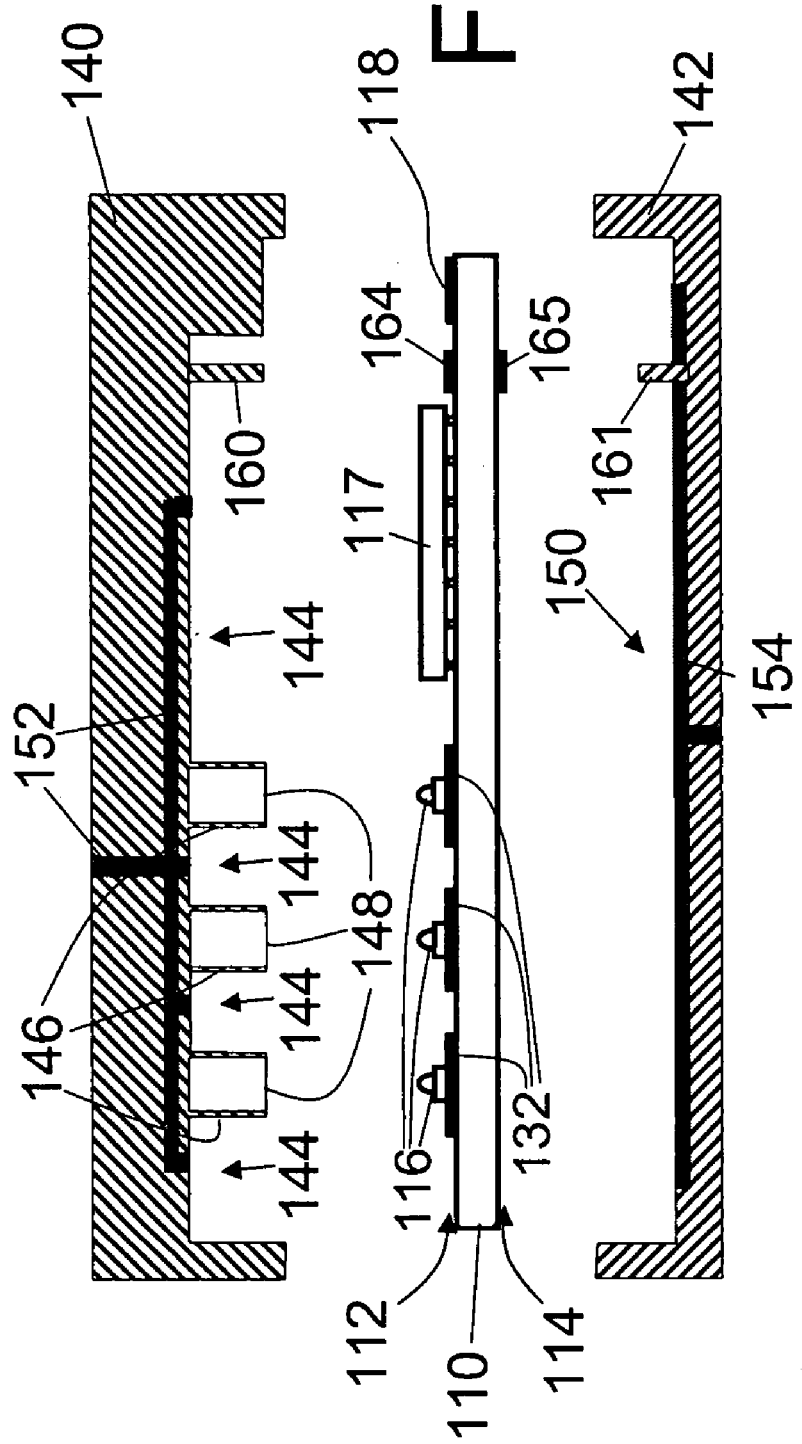
FIGS. 10-12 diagrammatically show a suitable injection overmolding process.
Figure 11:
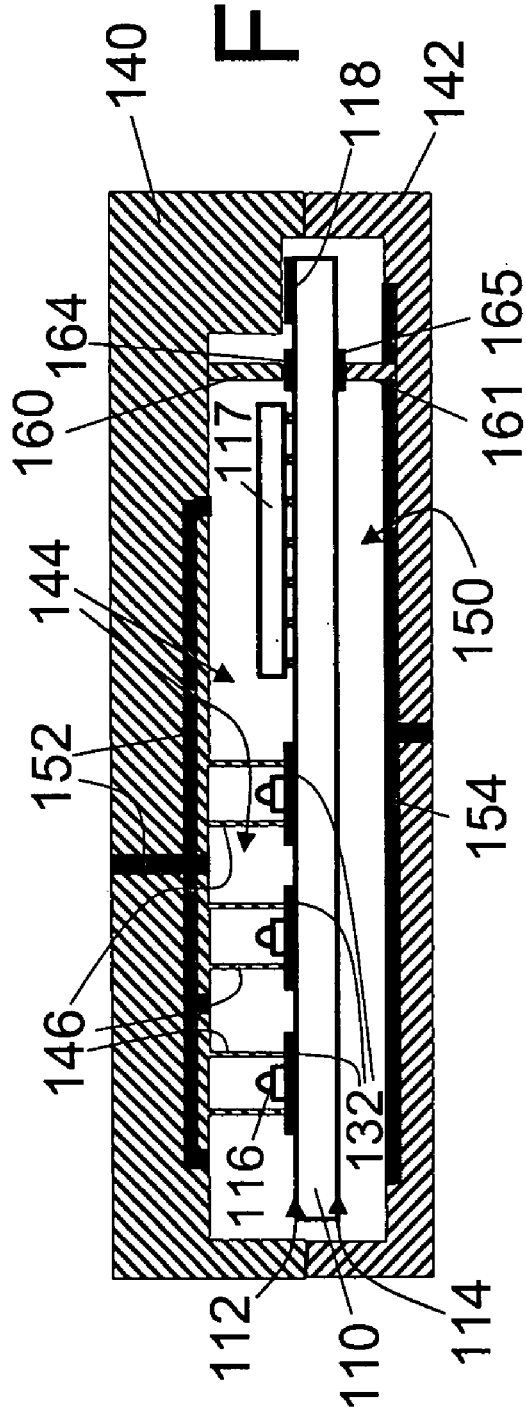
Figure 12:
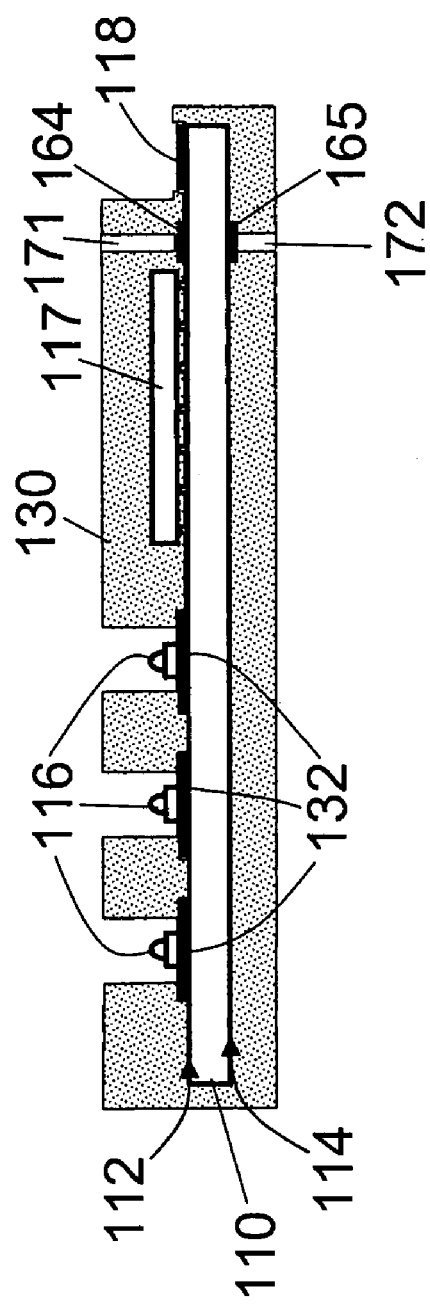

With reference to FIGS. 10-12, an injection overmolding process is illustrated. FIG. 10 shows a circuit board 110 with light emitting diode packages 116 and an electronic integrated circuit 117 disposed between tooling mold portions 140, 142 of a mold. FIG. 11 shows the mold portions 140, 142 closed together about the circuit board 110 with the light emitting diode packages 116 and the electronic integrated circuit 117. FIG. 12 shows the light emitting diode assembly comprising the circuit board 110 with the light emitting diode packages 116 and the electronic integrated circuit 117, and an overmolding 130 formed by injection molding using the closed tooling mold 140, 142 shown in FIG. 11.

More particularly, the circuit board 110 has a frontside 112 and a backside 114. One or more optoelectronic devices are disposed on the frontside 112, and optionally also on the backside 114. In the illustrated embodiment, light emitting diode packages 116 are disposed on the frontside 112. The illustrative assembly also includes the optional integrated circuit 117, which may be an LED driver, control electronics, or so forth. The illustrated assembly further includes an electrical pad 118 for electrical communication to, from, or both to and from, the assembly. Additionally or alternatively, one or more discrete electronic components (not shown) may be included. Each light emitting diode package 116 is surrounded by an annular gasket 132. The annular gaskets 132 are shown in side view, but have an annular shape and are mounted on the frontside 112 of the circuit board 110 in similar fashion to the gaskets 32 that are shown in detail in FIGS. 4 and 5.

Additionally, one or more pads are provided to seal contact points between pins of the tooling mold 140, 142 and the circuit board 10. In FIG. 12, illustrative pins 160, 161 extend from respective tooling mold portions 140, 142 and meet pads 164, 165 disposed on respective front and back sides of the circuit board 110. The pads 164, 165 suitably have geometry similar to the square or rectangular geometry of the pads 50 shown in. FIGS. 1-3, or can have circular, oval, or an otherwise-shaped geometry, or may be "fold-over" type pads similar to the pads 51. A single pair of illustrative opposing pins 160, 161 with mating pads 164, 165 are shown for expository purposes, but typically there will be several such pairs to provide sufficient mechanical securing of the circuit board 110 in the tooling mold 140, 142. Moreover, in some embodiments frontside and backside pins may not be directly opposite, although the net force generated on the frontside and on the backside should balance out in the aggregate.

As shown in FIG. 10, the circuit board 110 with light emitting diode packages 116, gaskets 132, and other components 117, 118 is disposed between mating portions or components 140, 142 of an insert mold. FIG. 11 shows the two mating mold components 140, 142 after mating to form the closed insert mold having an injection cavity containing the circuit board 110. The mold component 140 is designed with molding or injection regions 144 for forming the front-side of the injection overmolding 130, and isolation regions defined by pins or generally hollow members 146 having edges 148 (labeled only in FIG. 10) that seal against the gaskets 132 to isolate the light emitting diode packages 116 from the overmolding material. The illustrated generally hollow members 146 have an open volume that is substantially larger than the volume of the received light emitting diode 116; however, more generally the generally hollow member should have an open volume at least sufficiently large to receive the light emitting diode package 116 so as to isolate the light emitting diode package 116 from the sealant. In some contemplated embodiments, the generally hollow members may have less open volume; for example, in some embodiments the open volume is just slightly larger than, and conformably shaped with, the received optoelectronic device. The mating insert mold component 142 includes a molding or injection region 150 for forming the backside of the overmold 130. Additionally, it is seen in FIG. 11 that the molding pins 160, 161 meet with the corresponding pads 164, 165.

During injection overmolding, the precursor material is typically supplied in the form of pellets or other solid pieces (not shown) that are heated to form molten molding material that is delivered under pressure to the molding or injection regions 144, 150 by delivery conduits 152, 154 such as an illustrated sprue and runners delivery system. The overmolding material is typically injected under positive pressure, and fills the molding regions 144, 150 where it solidifies to define the overmolding 130. The gaskets 132 cooperate with the generally hollow members 146 to ensure that the overmolding material does not reach the light emitting diode packages 116. It will be noted that in the illustrated embodiment the overmolding 130 covers the integrated circuit 117, since there is no need to have this component exposed. On the other hand, the electrical pad 118 is exposed. Although not shown, it is contemplated to include an additional annular gasket surrounding the electrical pad 118 to prevent water ingress at that opening.

As the overmolding material solidifies, it forms a seal with the gaskets 132 to provide a seal against water ingress at the openings for the light emitting diode packages 116. In similar fashion, the solidifying overmolding material forms a seal with an outer annular region of the pads 164, 165. Typically, the overmolding material is prevented from coating the center of the pads 164, 165 due to the pressure of the pins 160, 161.

After the overmolding is solidified, the mold 140, 142 is opened and the optoelectronic device assembly is removed. Optionally, flash or other molding artifacts are trimmed off. The finished optoelectronic device assembly is shown in FIG. 12. It is noted that the overmolding 130 has openings for the light emitting diode packages 116 due to the presence of the generally hollow members 146 during the overmolding process. However, seals formed between the outer annular region of the gaskets 132 and the overmolding 130 prevent ingress of fluid at these openings. Similarly, the overmolding 130 has openings 171, 172 corresponding to where the pins 161, 162 were present during the overmolding process. Each such pin connects with the tooling mold 140, 142 and with the circuit board 110 during the overmolding process, and hence defines an open path to the circuit board 110 in the finished overmolding 130. However, the opening is sealed by the annular contact between the overmolding 130 and the sealing pads 164, 165.

After the overmolding process is complete, the light emitting diode packages 116 may be electrically energized via the circuit board 110 (for example, via the electrical pad 118) to generate light.

In the embodiment illustrated in FIGS. 10-12, the generally hollow members 146 have straight exterior sidewalls, resulting in openings with straight sidewalls in the overmolding 130, as shown in FIG. 12. In other embodiments, it is contemplated for the generally hollow members 146 to have slanting outer sidewalls to define cup-shaped openings with slanted sidewalls surrounding each optoelectronic device 116. Optionally, such cup-shaped openings may be coated with a reflective material after the overmolding to define a reflective cup that promotes light extraction. Similarly, it is contemplated for the gaskets 32, 132 to include reflective surfaces, optionally shaped, to also serve as reflectors to promote light extraction.

While an injection overmolding process is illustrated with reference to FIGS. 10-12, it is to be appreciated that the sealants 30, 30', 130 can be formed by substantially any sealing process, including for example injection overmolding, potting, hot melt sealing, or so forth. The use of annular gaskets to seal openings in the sealant that accommodate optoelectronic devices advantageously reduces water ingress that might otherwise damage the circuit board or other components of the optoelectronic device assembly.

The described injection overmolding process illustrated with reference to FIGS. 10-12 is a single-shot overmolding process, which has substantial advantages in terms of reduced cost and complexity compared with a multiple-shot overmolding process. However, it is also contemplated to employ a two-shot or multiple-shot overmolding process in conjunction with the illustrated gaskets 32, 132 and pin pads 50, 51, 164, 165.

While outdoor lighting has been mentioned as a typical application, the disclosed optoelectronic device assemblies with sealant including annular gaskets are contemplated for use in any environment that may entail exposure to potentially degrading or destructive fluids, such as pool lighting or other underwater applications, automotive applications in which fluids such as moisture, grease, road salt, oil, or so forth may reach the assembly, and in other like applications.

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. A method comprising:
   disposing an optoelectronic device on a circuit board, the disposing including electrically connecting the optoelectronic device with the circuit board;
   disposing an annular gasket on the circuit board to surround the optoelectronic device; and
   sealing the circuit board with a sealant that also covers at least an outer annular portion of the annular gasket, but does not cover the optoelectronic device, the sealing comprising (i) disposing the circuit board in an injection mold that includes a generally hollow member receiving the optoelectronic device and having an edge sealing against the gasket and (ii) injecting sealant material into the injection mold, the injected sealant material being blocked by the generally hollow member and the annular gasket from reaching the optoelectronic device.

2. The method as set forth in claim 1, wherein the sealing comprises:
   overmolding at least the front side of the circuit board and at least an outer annular portion of the annular gasket, but not the optoelectronic device.

3. The method as set forth in claim 1, wherein the sealing comprises:
   single shot overmolding at least the front side of the circuit board and at least an outer annular portion of the annular gasket, but not the optoelectronic device.

4. The method as set forth in claim 1, wherein the sealing comprises:

sealing the front side of the circuit board exclusive of the optoelectronic device but not a back side of the circuit board.

5. The method as set forth in claim 1, wherein the disposing of an annular gasket on the circuit board comprises:
adhering the annular gasket to the front side of the circuit board using an adhesive disposed between the annular gasket and the front side of the circuit board.

6. The method as set forth in claim 1, further comprising:
after the injected sealant material solidifies to define the sealant, removing the circuit board from the injection mold; and
substantially filling an opening in the sealant defined by the generally hollow member with a transmissive encapsulant that is transmissive for radiation generated or received by the optoelectronic device.

7. The method as set forth in claim 1, wherein the optoelectronic device includes a light emitting diode package, the method further comprising:
after the sealing, electrically energizing the light emitting diode package via the circuit board to generate light, the at least outer annular portion of the annular gasket remaining covered by the sealant during the electrical energizing.

8. The method as set forth in claim 1, further comprising:
disposing a pad or fold-over pad on or around an edge of the circuit board, wherein the disposing operation (i) of the sealing further includes contacting the pad or fold-over pad with a pin that defines an opening in the sealant, the sealant covering at least a portion of the pad or fold-over pad.

9. The method as set forth in claim 1, wherein the optoelectronic device includes a light emitting diode package.

10. The method as set forth in claim 1, wherein the annular gasket is made of the same material as the sealant material.

11. The method as set forth in claim 1, wherein the annular gasket has an inner perimeter that is substantially conformal with an outer perimeter of the optoelectronic device.

12. The method as set forth in claim 1, wherein the annular gasket has a hardness as measured in durometer of 40 Shore A hardness or higher.

13. The method as set forth in claim 1, wherein the sealing comprises:
sealing both the front side of the circuit board exclusive of the optoelectronic device and a back side of the circuit board.

* * * * *